United States Patent
Staszewski et al.

(10) Patent No.: US 6,414,555 B2
(45) Date of Patent: Jul. 2, 2002

(54) FREQUENCY SYNTHESIZER

(75) Inventors: Robert B. Staszewski, Garland; Dirk Leipold, Plano, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/790,376

(22) Filed: Feb. 22, 2001

Related U.S. Application Data

(60) Provisional application No. 60/186,445, filed on Mar. 2, 2000.

(51) Int. Cl.$^7$ ................................................. H03L 7/18
(52) U.S. Cl. ........................... 331/18; 331/16; 327/105; 327/156
(58) Field of Search ............................ 331/1 A, 16, 18, 331/25; 327/105–107, 156–159; 360/51; 375/376; 455/260

(56) References Cited

U.S. PATENT DOCUMENTS 4,458,214 A * 7/1984 Lakomy ..................... 331/1 A
5,019,786 A * 5/1991 Fairley et al. ............... 328/133

* cited by examiner

Primary Examiner—David Mis
(74) Attorney, Agent, or Firm—Pedro P. Hernandez; W. James Brady III; Frederick J. Telecky, Jr.

(57) ABSTRACT

A frequency synthesizer (500) includes a DDFS (502) and a PLL loop (526). The oscillator frequency signal (516) is used to create the DDFS clock signal (514), $f_{CLK}$ that acts as a system clock for the DDFS (502). With the phase/frequency state of the DDFS being adjusted based on a comparison of the DDFS system clock signal (514) with a frequency reference signal (520), $f_{REF}$. The DDFS system clock signal (514) is further divided by a divider (512) to establish an update clock signal (528), $f_{update}$. The output of the DDFS and the update clock signal (528) are compared by a phase/frequency detector (504). The output signal of the PFD (504) is preferably filtered by a loop filter (506) before using it as a tuning signal (522) for the DCO (508). The principle of bootstraping ensures that the synthesizer (500) is synchronous and every clock is derived from the same source.

15 Claims, 2 Drawing Sheets

FREQUENCY SYNTHESIZER

CROSS-REFERENCE TO RELATED APPLICATIONS

This application claims the benefit of U.S. Provisional Application No. 60/186,445, entitled "Bootstrap direct full-band frequency synthesizer", having attorney and filed on Mar. 2, 2000.

TECHNICAL FIELD

This invention relates in general to the field of radio communications and more specifically to a frequency synthesizer.

BACKGROUND

A large reduction of the transistor features in recently developed deep-submicron complementary metal-oxide semiconductor (CMOS) processes shifts the design paradigm towards more digitally intensive techniques. In a monolithic implementation, the manufacturing cost of a design is measured not in terms of the number of devices used, but rather in terms of the occupied silicon area used. A typical digital cellular telephone on the market today contains over a million transistors. Analog and radio frequency (RF) circuits, on the other hand, do not scale down very well. A low-noise charge pump, or a low-distortion image-rejection modulator, both good examples of classical RF transceiver components, occupy roughly about the same amount of semiconductor surface area as is used for tens of thousands of digital gates. This is equivalent to a lot of digital signal processing (DSP) power. Consequently, there are numerous incentives to look for digital solutions for both analog and RF circuits. Unfortunately, very little research work on this topic has been disclosed so far.

There are a few frequency synthesis techniques found in RF communication products, they include direct-digital, indirect or phase-locked loop (PLL), and hybrids that are a combination of the direct and indirect approaches. Each of these methods of frequency synthesis has advantages and disadvantages; hence each application requires selection based upon the most acceptable combination of compromises to the designer.

Indirect synthesis, also called phase-locked loop (PLL), compares the output of a voltage-controlled oscillator (VCO) with a phase of a reference signal, $f_{REF}$, as shown in the prior art PLL of FIG. 1. As the output of the PLL drifts, detected errors produce correction commands to the VCO, which responds accordingly. Error detection occurs in the phase frequency detector (PFD), which adds phase noise close to the carrier, though a PLL can outperform direct synthesis techniques at larger offsets. Fine frequency steps degrade phase noise, and fast switching is difficult to achieve with a PLL design even with the use of aggressive VCO pre-tuning techniques.

In general, an indirect synthesizer uses a PLL loop and a programmable fractional-N divider that multiplies the stable frequency, $f_{REF}$. In the loop, a loop filter (LF) is present so as to suppress spurs produced in the PFD so that they do not cause unacceptable frequency modulation in the VCO. However, the LF causes the degradation in transients, which limits the switching time. Therefore, the requirements for both the frequency switching time and the suppression of spurs are in conflict. Classical PLL-based frequency synthesizers are only suitable for narrow-band frequency modulation schemes, in which the modulating data rate is well within the PLL loop bandwidth.

The second major synthesis technique currently used today is direct-digital frequency synthesis (DDFS) which uses logic and memory components to digitally construct the desired output signal, and a data conversion device to convert it from the digital to the analog domain, as shown in FIG. 2. The DDFS method of constructing a signal is almost all digital, and the precise amplitude, frequency, and phase are known and controlled at all times. For these reasons, the switching speed is considered extremely high, but the power consumption could be excessive at high clock frequencies. The DDFS method is not entirely digital in the true sense of the word since it requires a digital-to-analog converter (DAC) and a low-pass filter to attenuate the spurious frequencies caused by the digital switching. In addition, a very stable clock of at least three times the output frequency is required, and the total power consumption is not acceptable for designs used in mobile communications.

Because it is very costly to implement a DDFS at frequencies of interest for wireless communications (e.g., multi-GHz range), this technique is currently being used mainly for military applications. Due to its waveform reconstruction nature, the DDFS technique is best suited for implementing wideband transmit modulation, as well as fast channel-hopping schemes. In FIG. 3, there is shown the prior art front-end of the phase accumulator shown in FIG. 2. The front-end uses an arithmetic adder that combines the frequency control word (FCW) components of the selected channel and the frequency-modulating data.

In certain design applications, it is necessary to combine the two (direct and indirect) major synthesis techniques such that the best features from each method are emphasized. For example, the wideband modulation and fast channel-hopping capability of the DDFS method, is combined with a frequency multiplication property of a PLL loop that up-converts it to the RF band. This is shown in FIG. 4 as a hybrid synthesizer 400 including a DDFS 402 and a PLL 404. The DDFS 402 generates a stable frequency reference to the main PLL loop 404. Since the DDFS 402 operates at a low frequency, its major limitation of high power is not a concern.

Deep-submicron CMOS processes present new integration opportunities to the designer, but make it difficult to implement traditional analog circuits. For example, frequency control input of a low-voltage deep-submicron CMOS oscillator is an extremely challenging task due to its highly nonlinear frequency versus voltage characteristics and low voltage headroom making it susceptible to the power supply and substrate noise. In such a low supply voltage case, the dynamic range of the signal and thus the signal-to-noise (S/N) ratio will degrade significantly. In this case, a circuit designer has to look for alternative solutions, such as utilizing a voltage doubler. Furthermore, the advanced CMOS processes typically use low resistance P-substrate that is an effective means in combating latch-up problems, but exacerbates substrate noise coupling into the analog circuits. This problem only gets worse with scaling down of the supply voltage. In order to address the various deep-submicron RF integration issues, some new and radical system and architectural changes have to be discovered.

BRIEF DESCRIPTION OF THE DRAWINGS

The features of the present invention, which are believed to be novel, are set forth with particularity in the appended claims. The invention, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
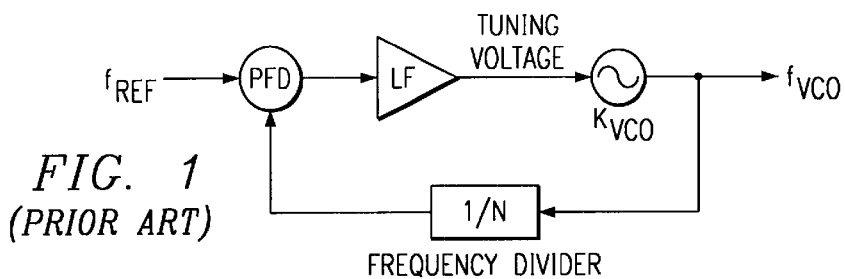
FIG. 1 shows a block diagram of a prior art PLL.
Figure 2:
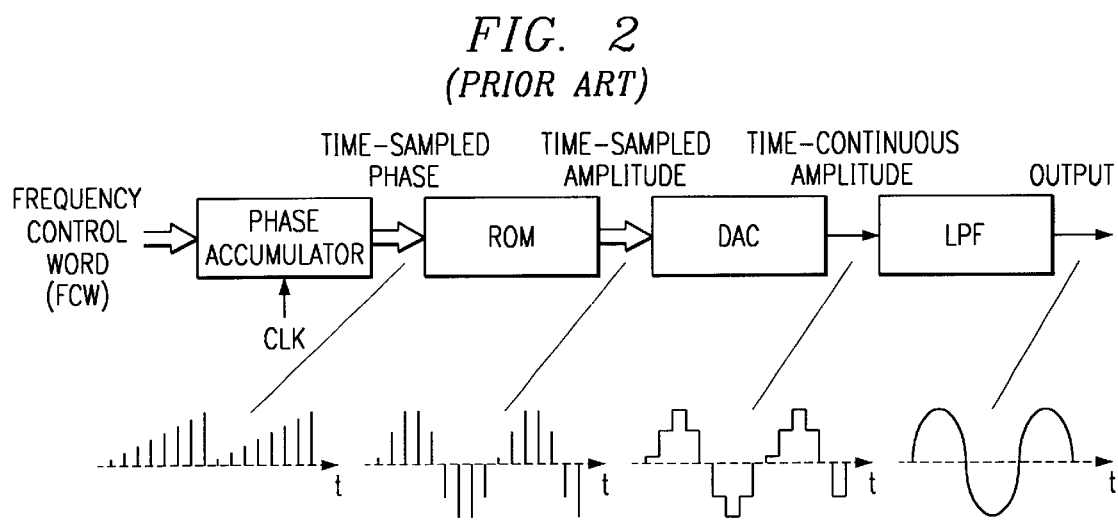
FIG. 2 shows a block diagram of a prior art DDFS.
Figure 3:
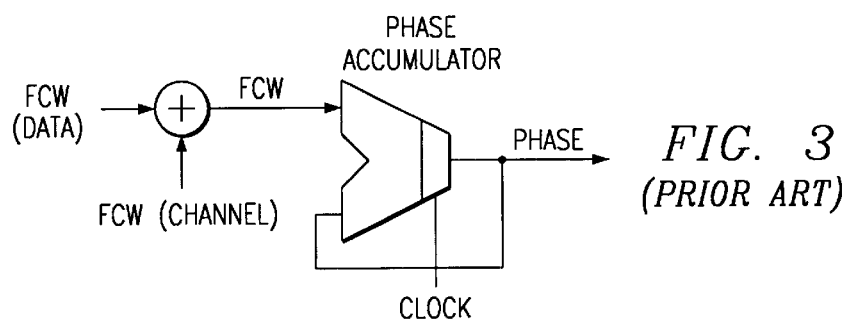
FIG. 3 shows a prior art front-end of the phase accumulator of the DDFS of FIG. 2.
Figure 4:
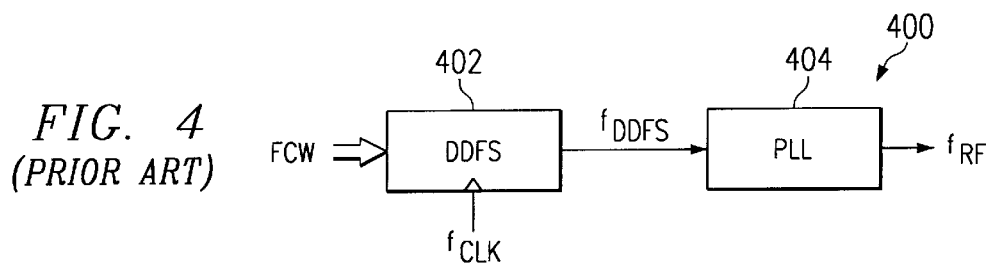
FIG. 4 shows a block diagram of a prior art hybrid synthesizer.

While the specification concludes with claims defining the features of the invention that are regarded as novel, it is believed that the invention will be better understood from a consideration of the following description in conjunction with the drawing figure.

Figure 5:
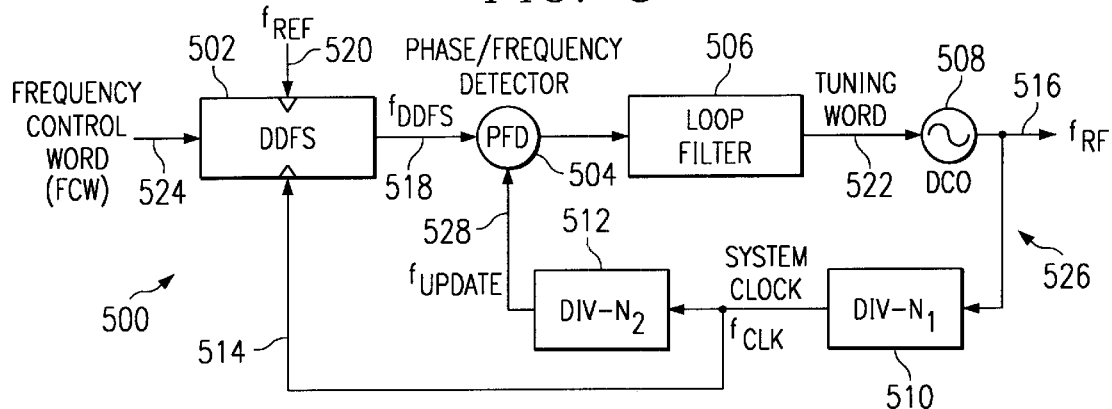
FIG. 5 shows a block diagram of a synthesizer in accordance with the invention.

A frequency synthesizer in accordance with the invention is shown in FIG. 5. The synthesizer 500 maximizes digital hardware content in order to make it very amenable to deep sub-micron CMOS processes. The example shown in FIG. 5, is for a 2.4 GHz transceiver for use in a Bluetooth application. The 2.4 GHz VCO can be implemented as a digital-controlled oscillator (DCO) 508. Similarly, the loop filter (LF) 506 can be implemented in a digital manner.

The frequency synthesis is accomplished through the combination of a scaled-down DDFS 502 and a phase-lock-loop (PLL) 526 which includes the PFD 504, loop filter 506, DCO 508, first divider (divide by $N_1$) 510 and second divider (divide by $N_2$) 512. The first divider 510 is optional given that in some applications a divide-by-1 in that part of the loop can be used. In a typical example, the first divider 510 is set to divide by four and second divider 512 is set to divide by sixty-four, giving an $f_{CLK}$ signal 514 frequency of 600 MHz and a $f_{update}$ signal 528 frequency of 9.375 MHz.

The wideband modulation and fast channel-hopping capability of the DDFS method, that operates at a lower frequency in accordance with the invention, is combined with the frequency multiplication property of a PLL loop that upconverts the DDFS output ($f_{DDFS}$) 518 to the RF band, in this case 2.4 GHz. In this way, the best features from each basic synthesis method are emphasized. The composite PLL loop is an all-digital PLL (ADPLL) architecture which generates the 2.4 GHz output signal ($f_{RF}$) 516. The underlying frequency stability of the system is derived from the reference crystal oscillator signal ($f_{REF}$) 520, such as a 13 MHz signal as used in a GSM system.

The down-divided (by $N_1$) DCO frequency signal ($f_{CLK}$) 514 is used as a digital system clock mainly for the DDFS block 502, which can generate frequency roughly up to one-third of its clock frequency. As stated previously, the DDFS cannot generate the RF frequency directly for practical reasons.

The $f_{CLK}$ signal 514 is further divided by a second divider 512 by $N_2$ to establish the update frequency signal ($f_{update}$) 528. The output of the DDFS ($f_{DDFS}$) 518 and the $f_{update}$ signal 528 are compared by the PFD 504. Its output is then filtered by the LF 506 before the signal is used as a tuning signal 522 (tuning word or tuning voltage) of the oscillator (DCO) 508. The phase/frequency detection process is performed between the DDFS output and the divide-by ($N_1 \cdot N_2$) clock. The output of the PFD 504 can be filtered by the loop filter (LF) 506 before being used as the tuning word of the DCO 508.

The system clock deviation from the ideal timing instances, as determined by the frequency reference $f_{REF}$ clock signal 520 establishes the long-term frequency stability, and will appropriately adjust the phase accumulator content. This principle of "bootstrapping" ensures that the system is synchronous and every internal clock is derived from the same source. The $f_{REF}$ input to the DDFS 502 is not used as an actual sampling clock but is used to update the frequency control word (FCW) of the DDFS 502.

As the oscillator frequency drifts, the FCW 524 provided to the DDFS input gets corrected such that the "reference" input ($f_{DDFS}$ 518) provided to the second stage PLL causes the oscillator to pull back.

Although the LF 506 and the first divider 510 are optional, they are likely to be used in most implementations. As shown in FIG. 5, the DDFS 502 which is clocked by the $f_{CLK}$ signal 514 is commanded by the FCW 524 to generate the lower-frequency output that, after $N_1 \cdot N_2$ frequency multiplication by the PLL loop, corresponds to the desired output frequency $f_{RF}$ 516 of the channel and instantaneous modulating data.

Figure 6:
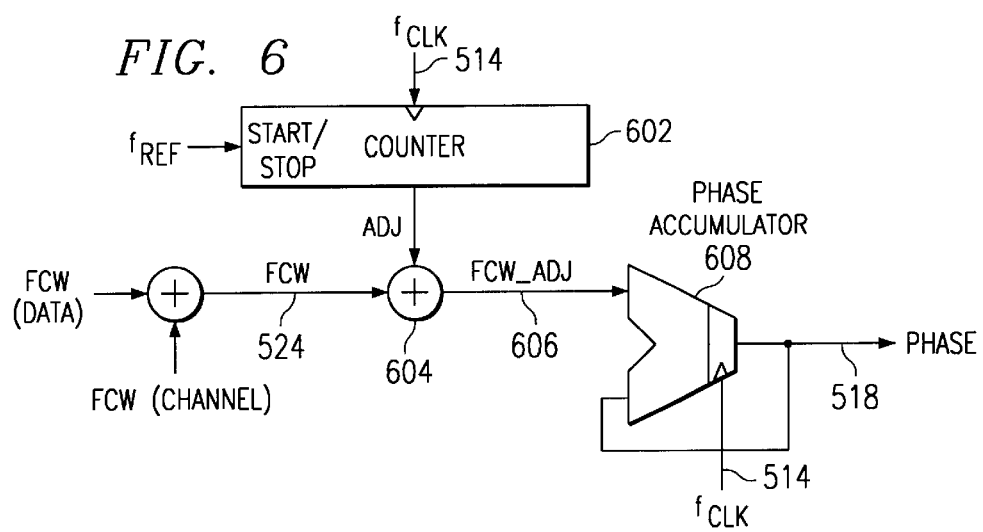
FIG. 6 shows a DDFS structure using a counter for FCW correction in accordance with the invention.

An example of such FCW correction in accordance with the invention is shown in FIG. 6, where the oscillator frequency drift is determined by counting the high frequency $f_{CLK}$ edges using counter 602 in a single or multiple $f_{REF}$ clock cycles. The thus obtained correction then gets added to the FCW 524 using adder 604. The adjusted FCW or FCW_ADJ 606 is then sent to the phase accumulator 608.

Figure 7:
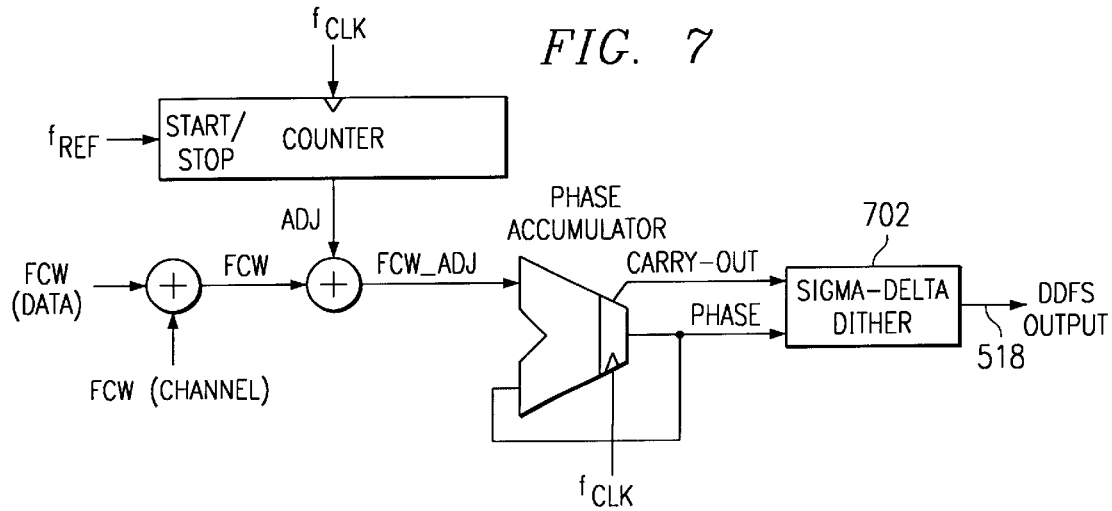
FIG. 7 shows a DDFS structure as in FIG. 6 using a sigma-delta dither block in accordance with another aspect of the invention.

The channel selection and transmitter modulation can be further refined through a scaled-down DDFS with sigma-delta ($\Sigma\Delta$) modulation of the phase position pulses that shape the frequency spectrum of the integer quantization. The circuit is similar to that shown in FIG. 6 with the $\Sigma\Delta$ modulation being accomplished using a sigma-delta dither block 702. The high-jitter content of the phase accumulator output (phase position pulses) are dithered with high-frequency noise shaping through the sigma-delta dither block 702 such that the quantization energy is easily filtered out by the PLL loop 526. Only the phase accumulator part of a conventional DDFS is used as shown in FIGS. 6 and 7, with the inclusion of the counter 602 and other adjustment circuit provided in accordance with the present invention. The output signal ($f_{DDFS}$) 518 of the DDFS 502 is used as the "reference" frequency to the second stage PLL loop 526 as mentioned previously.

The present invention given its digitally intensive synthesizer implementation provides for improvements in power consumption, decrease in silicon area for the design, as also provides for lower parameter variability than with conventional analog circuits.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A synthesizer, comprising:
   a phase-lock-loop (PLL) including an oscillator and providing an output signal ($f_{RF}$); and
   a digital direct frequency synthesis (DDFS) block coupled to the PLL and including an input port for receiving a frequency control word, a counter, adder and a phase accumulator, the counter and phase accumulator both having input ports for receiving the PLL output signal and using it as a DDFS system clock signal, the counter having a second input port for receiving a reference clock signal and an output port for providing an adjustment signal, the adder adding the frequency control word and the adjustment signal to produce an adjusted frequency control word which is provided to the phase accumulator.

2. A synthesizer as defined in claim 1, wherein the PLL further includes a phase/frequency detector (PFD) coupled to the oscillator.

3. A synthesizer as defined in claim 1, wherein the adjustment signal provided by the counter adjusts the phase/frequency state of the DDFS block.

4. A synthesizer as defined in claim 2, the PLL further comprising a divider coupled to the oscillator and the divider includes an output for providing an update clock signal ($f_{update}$) to the PFD.

5. A synthesizer as defined in 4, wherein the phase accumulator has an output port for providing a DDFS output signal ($f_{DDFS}$) and the PFD compares the DDFS output signal with the update clock signal ($f_{update}$).

6. A synthesizer as defined in claim 1, wherein the phase accumulator provides an output signal comprising phase position pulses and the DDFS block further comprises a sigma-delta dither block responsive to the phase accumulator output signal.

7. A synthesizer as defined in claim 1, wherein the reference clock signal ($f_{REF}$) causes the frequency control word to be updated.

8. A frequency synthesizer, comprising:
a phase-lock-loop (PLL) including:
a phase/frequency detector (PFD) having an input port; and
a oscillator coupled to the PFD, the oscillator having an output port for providing an output signal;
a counter having a first input port for receiving the oscillator output signal, and a second input port for receiving a reference clock signal, the counter having an output for providing an adjustment signal;
an adder having a first input port for receiving a frequency control signal and a second input port for receiving the adjustment signal and an output port for providing an adjusted frequency control signal; and
a phase accumulator having an input port for receiving the adjusted frequency control signal and an output port for providing a reference signal to the PFD input port.

9. A frequency synthesizer as defined in claim 8, further comprising a divider coupled between the oscillator and the PFD.

10. A frequency synthesizer as defined in claim 9, wherein the divider divides the output signal provided by the oscillator and provides a divided down signal to the PFD.

11. A frequency synthesizer as defined in claim 8, wherein the oscillator comprises a digitally controlled oscillator (DCO).

12. A frequency synthesizer as defined in claim 8, wherein the counter counts the number of clock edges of the output signal found in one or more clock cycles of the reference clock signal.

13. A frequency synthesizer as defined in claim 12, further comprising a second divider for dividing down the clock signal prior to presenting the output signal to the counter.

14. A frequency synthesizer as defined in claim 12, wherein the output signal is also provided to the phase accumulator.

15. A frequency synthesizer as defined in claim 9, further comprising a sigma-delta dither block having an input port for receiving the reference signal provided by the phase accumulator and dithering the reference signal with high-frequency noise shaping using sigma-delta modulation.

* * * * *